United States Patent
Kawaishi

(10) Patent No.: US 6,798,071 B2
(45) Date of Patent: Sep. 28, 2004

(54) SEMICONDUCTOR INTEGRATED CIRCUIT DEVICE

(75) Inventor: Kaneo Kawaishi, Kyoto-fu (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/188,748

(22) Filed: Jul. 5, 2002

(65) Prior Publication Data

US 2003/0006490 A1 Jan. 9, 2003

(30) Foreign Application Priority Data

Jul. 6, 2001 (JP) ........................................ 2001-206134

(51) Int. Cl.[7] .............................................. H01L 23/48
(52) U.S. Cl. ......................... 257/777; 257/723; 257/784
(58) Field of Search .............................. 257/777, 723, 257/784, 676, 686, 685, 690, 692, 691, 678, 734, 684

(56) References Cited

U.S. PATENT DOCUMENTS 6,037,661 A * 3/2000 Palagonia et al. ............ 257/723
6,410,987 B1 * 6/2002 Kanemoto et al. ........... 257/777

FOREIGN PATENT DOCUMENTS

| JP | 3-178140 | | 8/1991 | |
| JP | 10178321 A | * | 6/1998 | ............. H03F/3/60 |

* cited by examiner

Primary Examiner—Carl Whitehead, Jr.
Assistant Examiner—Laura M Schillinger
(74) Attorney, Agent, or Firm—Nixon & Vanderhye P.C.

(57) ABSTRACT

In a semiconductor IC device, a first IC chip having a plurality of first electrodes and a second IC chip having a plurality of second electrodes are stacked. A plurality of relay electrodes are provided on the first IC chip. The first electrodes are electrically connected to a lead frame via respective first conductive wires. One end of each of the relay electrodes is electrically connected to the respective second electrodes via respective second conductive wires and the other end of each of the relay electrodes is connected the lead frame via third conductive wires. No one of the second conductive wires crosses another one of the other second conductive wires and no one of the third conductive wires crosses another one of the third second conductive wires.

15 Claims, 7 Drawing Sheets

☐ UPPERMOST METAL LAYER
▨ LOWER METAL LAYER
▨ CONTACT LAYER INTERCONNECTING METAL LAYERS

SEMICONDUCTOR INTEGRATED CIRCUIT DEVICE

BACKGROUND OF THE INVENTION

The present invention relates to the technology of semiconductor integrated circuit (IC) devices.

There is a semiconductor integrated circuit device which, as shown in FIG. 7, has two stacked semiconductor IC chips 71 and 72. Pads of the lower semiconductor IC chip 71 are arranged in the order of address pad 171A, input/output (I/O) pad 171B, and I/O pad 171C. Pads of the upper semiconductor IC chip 72 are arranged in the order of address pad 172A, I/O pad 172B, I/O pad 172C, and address pad 172D.

In connecting the semiconductor IC chips 71 and 72 with a lead frame 73 having an address lead electrode 73a, an I/O lead electrode 73b, an I/O lead electrode 73C, and an address lead electrode 73d by wire-bonding method, the arrangement of the pads of the upper semiconductor IC chip 72 should be consistent with the arrangement of the pads of the lower semiconductor IC chip 71. If the pads of the upper semiconductor IC chip 72 are arranged in consistence with the pads of the lower semiconductor IC chip 71, wiring of the upper semiconductor IC chip 72 can be accomplished by performing wiring with reference to the pad arrangement of the lower semiconductor IC chip 71. In this case, even though there is a difference in the number of address pins, the number of I/O pins, and/or the number of control pins between the two chips due to a difference in the capacity and the kind of the devices, there is no problem so long as the pad arrangements of the two chips are consistent with each other.

However if, as shown in FIG. 8, a semiconductor IC chip 82 laid on the lower semiconductor IC chip 71 has pads arranged in the order different from the pads of the latter, namely, the pads 182A–182D of the semiconductor IC chip 82 are arranged in the order of I/O pad 182A, address pad 182B, address pad 182C, and I/O pad 182D, it follows that conductive wires extending from the upper semiconductor IC chip 82 to the lead frame 73 cross each other. Thus wiring for the upper chip is impossible and the two chips cannot be formed as a composite memory, for example.

As described above, in the case where the arrangement of the pads of the upper device and that of the pads of the lower device are different from each other, wire bonding between the lower chip and the lead frame is accomplished properly, but the wires extending between the upper chip and the lead frame cross each other and defective continuity occurs. Consequently, it is impossible to accomplish wiring between the upper chip and the lead frame, so that a composite device cannot be obtained.

If wire bonding is performed with reference to the upper chip, i.e., a lead frame that does not cause crossing of the wires extending between the upper chip and the lead frame is used, then the wires extending between the lower chip and the lead frame cross each other, and defective continuity occurs therebetween. Consequently, it is impossible to accomplish wiring between the lower chip and the lead frame.

If the upper and lower chips have similar or mutually consistent pad arrangements but the upper chip is much smaller than the lower chip, it follows that wires between the upper chip and the lead frame are necessarily long. In this case, in packaging the upper chip and lower chip with molding resin, the long conductive wires would be displaced by the molding resin and defective continuity occurs.

In a semiconductor IC device disclosed in Japanese Patent Application Laid-Open No. 3-178140, relay electrodes are provided on a silicon substrate on which a semiconductor IC chip is placed. Chip electrodes are connected to the respective relay electrodes with a conductive wire, and then the relay electrodes are connected to respective inner leads with a conductive wire, whereby the conductive wires are shortened to prevent occurrence of defective continuity thereof. However because the Japanese Patent Application Laid-Open No. 3-178140 does not deal with a composite device, the problem of different pad arrangements between the upper and lower chips is not considered therein.

SUMMARY OF THE INVENTION

Therefore, it is an object of the present invention to provide a semiconductor IC device allowing optimum wiring to be accomplished for first and second semiconductor IC chips so that both chips are formed into a composite device.

To achieve the object, a semiconductor integrated circuit device of the present invention comprises:
- a first semiconductor integrated circuit chip having a plurality of first electrodes;
- a second semiconductor integrated circuit chip mounted on the first semiconductor integrated circuit chip and having a plurality of second electrodes;
- a package sealing the first and second semiconductor integrated circuit chips;
- a lead frame electrically connected to the first electrodes via the respective first conductive wires;
- a plurality of relay electrodes provided on the first semiconductor integrated circuit chip;
- a plurality of second conductive wires electrically connecting one end of each of the relay electrodes and the respective second electrodes to each other; and
- a plurality of third conductive wires electrically connecting the other end of each of the relay electrodes and the lead frame to each other,
- wherein no one of the second conductive wires crosses another one of the other second conductive wires and no one of the third conductive wires crosses another one of the third second conductive wires.

The first electrodes may have attributes different from one another, and the second electrodes have attributes different from one another, and an arrangement of the attributes of the first electrodes and that of the attributes of the second electrodes may be different from each other.

In the semiconductor integrated circuit device, wire bonding between the first and second semiconductor integrated chips and the lead frame is carried out such that the first and second electrodes of the same attribute are connected to an identical corresponding lead of the lead frame. More specifically, the first electrodes are electrically connected to the lead frame via the first conductive wires, while the second electrodes are electrically connected to the one end of the relay electrodes via the respective second conductive wires, and the other end of each relay electrode is electrically connected to the lead frame via the third conductive wires. At this time, if the relay electrodes have an appropriate pattern, the second conductive wires do not cross each other and the third conductive wires also do not cross each other even when the arrangement or sequence of the attributes of the first electrodes is different from that of the attributes of the second electrodes. Thus, defective continuity between the second semiconductor integrated circuit chip and the lead frame is avoided. That is, even if the arrangement of the attributes of the first electrodes is different from that of the attributes of the second electrodes, optimum wiring can be accomplished for the first and second semiconductor integrated circuit chips. Thus, the first and second semiconductor integrated circuit chips can be formed into a composite device.

Even though there is a big difference in size between the first semiconductor integrated circuit chip and the second semiconductor integrated circuit chip, neither the second wires nor the third wires are prevented from being too long because the one end of the relay electrodes and the second electrodes are electrically connected via the respective second conductive wires, and the other end of the relay electrodes and the lead frame are electrically connected via the respective third conductive wires. Therefore when the package is formed by molding resin, the second electrodes and the third electrodes are prevented from being displaced or moved by the molding resin. Thus, defective continuity between the second semiconductor integrated circuit chip and the lead frame is prevented. That is, even though there is a big difference in size between the first semiconductor integrated circuit chip and the second semiconductor integrated circuit chip, optimum wiring can be accomplished for the first and second semiconductor integrated circuit chips. Thus, the first and second semiconductor integrated circuit chips can be formed as a composite device.

In one embodiment, the first electrodes are arranged along an edge of the first semiconductor integrated circuit chip, while the second electrodes are arranged along an edge of the second semiconductor integrated circuit chip approximately parallel with the edge of the first semiconductor integrated circuit chip. And, at least one of the relay electrodes has at least one bent portion so that the ends of the at least one relay electrode are placed in different positions relative to a direction parallel to the edge of the first or second semiconductor integrated circuit chip. This construction makes it possible to dispose one end of each relay electrode adjacent to the associated second electrode, while disposing the other end of each relay adjacent to the first electrode corresponding to the second electrode.

Alternatively, each relay electrode may be oblong or rectangular and extends in a direction intersecting the edge of the first semiconductor integrated circuit chip.

In one embodiment, the relay electrodes comprise at least two first conductive layers disposed at an upper-surface side thereof, a second conductive layer disposed at a lower level than the first conductive layers, and a connection part for electrically connecting the first conductive layers and the second conductive layer to each other.

That is, the relay electrodes are three-dimensional. Thus, even if the relay electrodes are complicated in the configuration and disposition thereof, it is possible to prevent them from crossing each other and being electrically connected to each other.

In one embodiment, the first conductive layers and the second conductive layer are be made of metal. Since the first conductive layers disposed at the upper-surface side of the relay electrodes are made of metal, wire bonding can be carried out on the first conductive layers.

In one embodiment, the first electrodes are arranged along an edge of the first semiconductor integrated circuit chip, while the second electrodes are arranged along an edge of the second semiconductor integrated circuit chip approximately parallel with the edge of the first semiconductor integrated circuit chip. The first conductive layers of each relay electrode are oblong and extend in a direction intersecting the edge of the first semiconductor integrated circuit chip, and the second conductive layer of each relay electrode is oblong and extends in a direction intersecting the first conductive layers. The connection part is provided at each intersection between the first and second conductive layers.

With the above arrangement, one of the two first conductive layers is allowed to be disposed adjacent to the associated second electrode, and the other of the two first conductive layers is allowed to be disposed adjacent to the first electrode corresponding to the second electrode.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

The semiconductor IC device of the present invention will be described in detail below with reference to the drawings.

Figure 1:
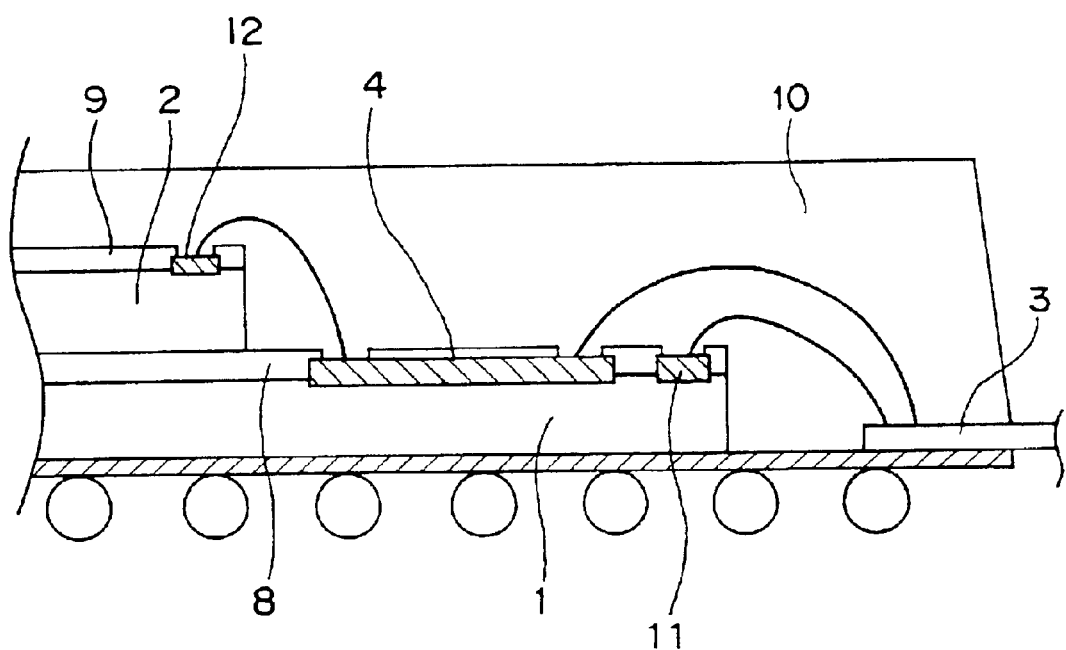
FIG. 1 is a conceptual sectional view showing a semiconductor integrated circuit (IC) device of an embodiment of the present invention.
Figure 2:
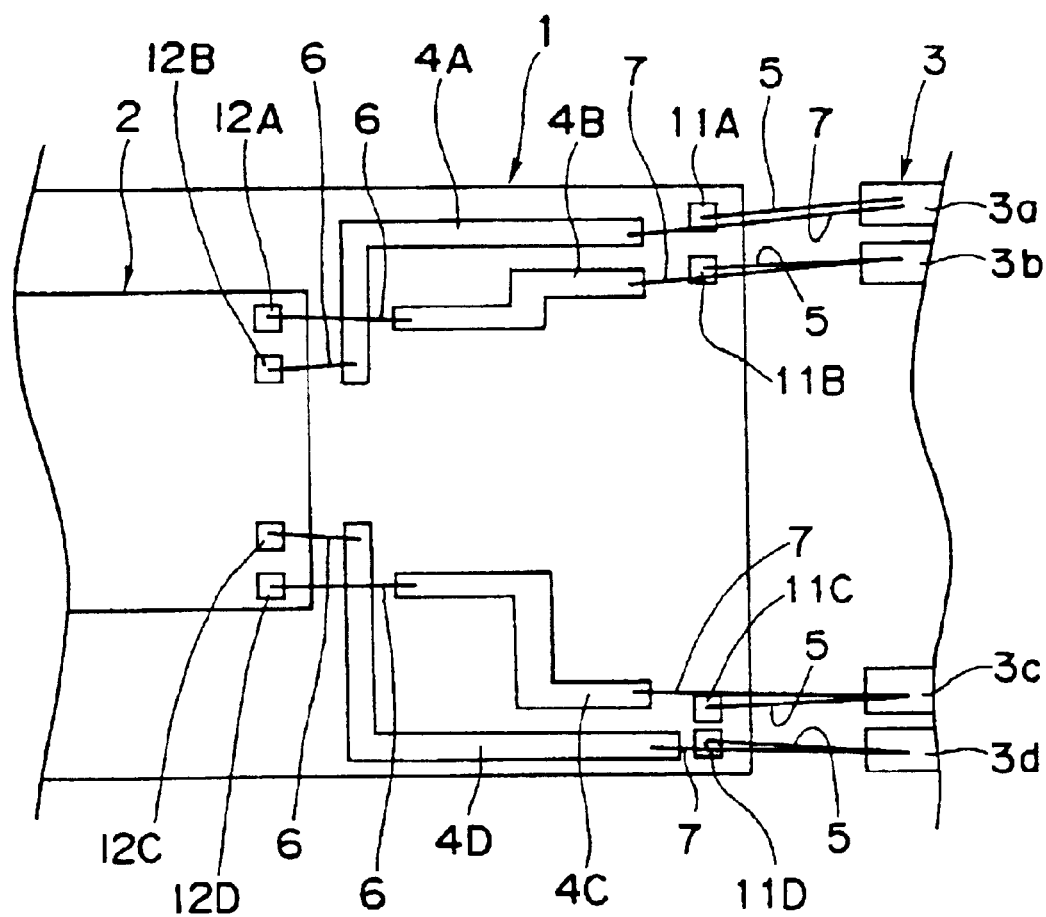
FIG. 2 is a schematic plan view of the semiconductor IC device shown in FIG. 1.

FIG. 1 is a conceptual sectional view for explaining the connection relationship of wires of a semiconductor IC device of an embodiment of the present invention. FIG. 2 is a schematic plan view showing main portions of the semiconductor IC device shown in FIG. 1. The semiconductor IC device is formed as a composite device by stacking two chips having different arrangements or sequences of pads. A protection film is not shown in FIG. 2 for the sake of simplicity and facilitation of understanding.

As shown in FIG. 1, the semiconductor IC device is a composite device having two chips stacked one on the other. That is, the semiconductor IC device has a first semiconductor IC chip 1, a second semiconductor IC chip 2 which is mounted on the first semiconductor IC chip 1 and smaller in size than the first semiconductor IC chip 1, and a package 10 sealing the first and second semiconductor IC chips 1 and 2.

As shown in FIG. 2, a plurality of first electrodes having different attributes are disposed on the lower first semiconductor IC chip 1 along an edge of the chip 1. Also, a plurality of second electrodes having different attributes are disposed on the upper second semiconductor IC chip 2 along an edge of the chip 2 approximately parallel with the above edge of the chip 1. More specifically, as the first electrodes, the lower first semiconductor IC chip 1 has an address pad 11A, an I/O pad 11B, an I/O pad 11C, and an address pad 11D (which are generally denoted by reference number 11) arranged in this order. Also, as the second electrodes, the upper second semiconductor IC chip 2 has an I/O pad 12A, an address pad 12B, an address pad 12C, and an I/O pad 12D (which are generally denoted by reference number 12) arranged in this order.

There is a difference in arrangement or sequence of the attributes of the pads between the lower first semiconductor IC chip 1 and the upper second semiconductor IC chip 2. That is, there is a difference between the pad sequence of the first semiconductor IC chip 1 and that of the second semiconductor IC chip 2. More specifically, the pads of the lower first semiconductor IC chip 1 are arranged in the order of address pad 11A, I/O pad 11B, I/O pad 11C, and address pad 11D from the upper side of FIG. 2 to the lower side thereof. On the other hand, the pads of the upper second semiconductor IC chip 2 are arranged in the order of I/O pad 12A, address pad 12B, address pad 12C, and I/O pad 12D from the upper side of FIG. 2 to the lower side thereof.

The address pad 11A, the I/O pad 11B, the I/O pad 11C, and the address pad 11D of the first semiconductor IC chip 1 are electrically connected to a lead frame 3 through a plurality of first conductive wires 5. The lead frame 3 has an address lead electrode 3a, an I/O lead electrode 3b, an I/O lead electrode 3c, and an address lead electrode 3d, which are connected to the address pad 11A, the I/O pad 11B, the I/O pad 11C, and the address pad 11D respectively through the first conductive wires 5. The first conductive wires 5 do not cross each other.

As an example of relay electrodes, a plurality of metal wires (dummy pads) 4A–4D are provided on the first semiconductor IC chip 1. One end of the metal wires 4A, 4B, 4C, and 4D are electrically connected to the address pad 12B, the I/O pad 12A, the I/O pad 12D, and the address pad 12C, respectively, via second conductive wires 6. The other end of each of the metal wires 4A, 4B, 4C, and 4D is electrically connected to the address lead electrode 3a, the I/O lead electrode 3b, the I/O lead electrode 3c, and the address lead electrode 3d, respectively, via third conductive wires 7. To realize these connections, the metal wires 4A–4D are composed of pads each having not the same rectangular or oblong pattern, but a pattern accommodated to the pad sequences or arrangements of the first semiconductor IC chip 1 and the second semiconductor IC chip 2. More specifically, each relay electrode has one or two bent portions so that the ends of each relay electrode are placed in different positions relative to a direction parallel with the edge of the first or second semiconductor IC chip. Thus, one end of each relay electrode is allowed to confront the second electrode associated with this relay electrode, while the other end of each relay electrode is allowed to confront the first electrode corresponding to the second electrode in the attribute. The second conductive wires 6 do not cross each other, nor the third conductive wires 7 cross each other.

As shown in FIG. 1, a protection film 8 is formed on the first semiconductor IC chip 1 to cover most parts of the metal wires 4 (4A–4D). The upper surface of the metal wires 4A, 4B, 4C, and 4D is exposed only at the opposite ends of each wire. To electrically connect the address pad 11A, the I/O pad 11B, the I/O pad 1C, and the address pad 11D to the lead frame 3, the upper surfaces of the pads 11A–11D are also exposed. A protection film 9 is also formed on the second semiconductor IC chip 2. To electrically connect the I/O pad 12A, the address pad 12B, the address pad 12C, and the I/O pad 12D to the respective associated metal wires 4A–4D, the upper surface of each of the pads 12A–12D is exposed.

In the semiconductor IC device having the construction, the metal wires 4A–4D having a pattern accommodated to the sequence or arrangement of the pads of the upper second semiconductor IC chip 2 are used as the relay electrodes for connecting the upper chip 2 and the lead frame 3 to each other. Thus irrespective of the arrangement of the pads of the upper second semiconductor IC chip 2, it is possible to realize wiring not inducing a defective conductivity. That is, wiring can be accomplished in such a way that no one of the second conductive wires 6 crosses another one of the wires 6 and that the none of the third conductive wires 7 crosses another one of the wires 7. Accordingly the first semiconductor IC chip 1 and the second semiconductor IC chip 2 can be formed as a composite device.

In the embodiment shown in FIGS. 1 and 2, the relay electrodes are formed from an uppermost metal layer of the first semiconductor IC chip 1. Alternatively, the relay electrodes may be formed of a plurality of conductive layers disposed at different levels in the first semiconductor IC chip 1.

Figure 3:
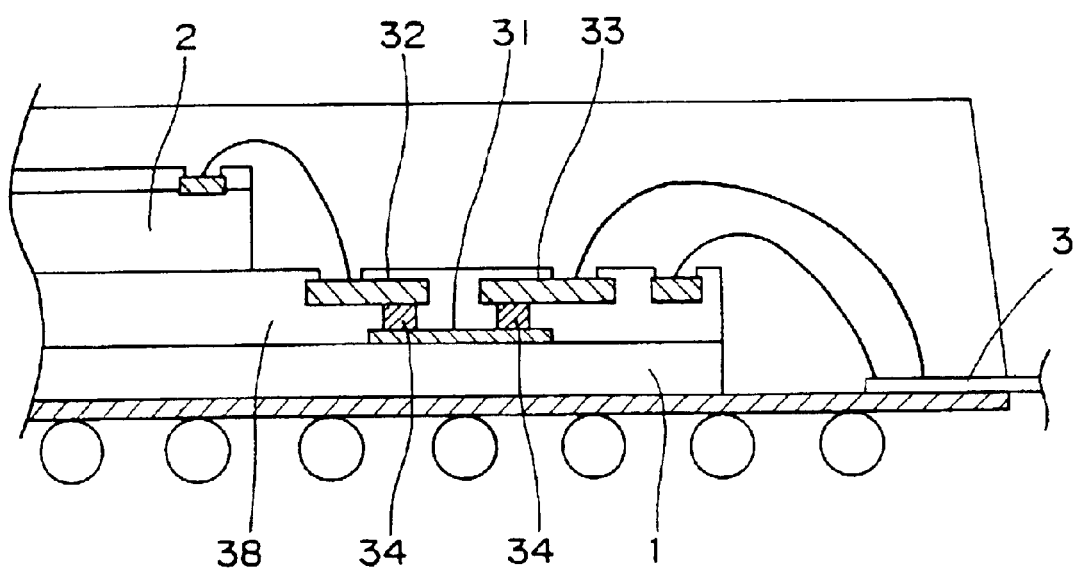
FIG. 3 is a conceptual sectional view of a semiconductor IC device according to the present invention for explaining a modification of relay electrodes.
Figure 4:
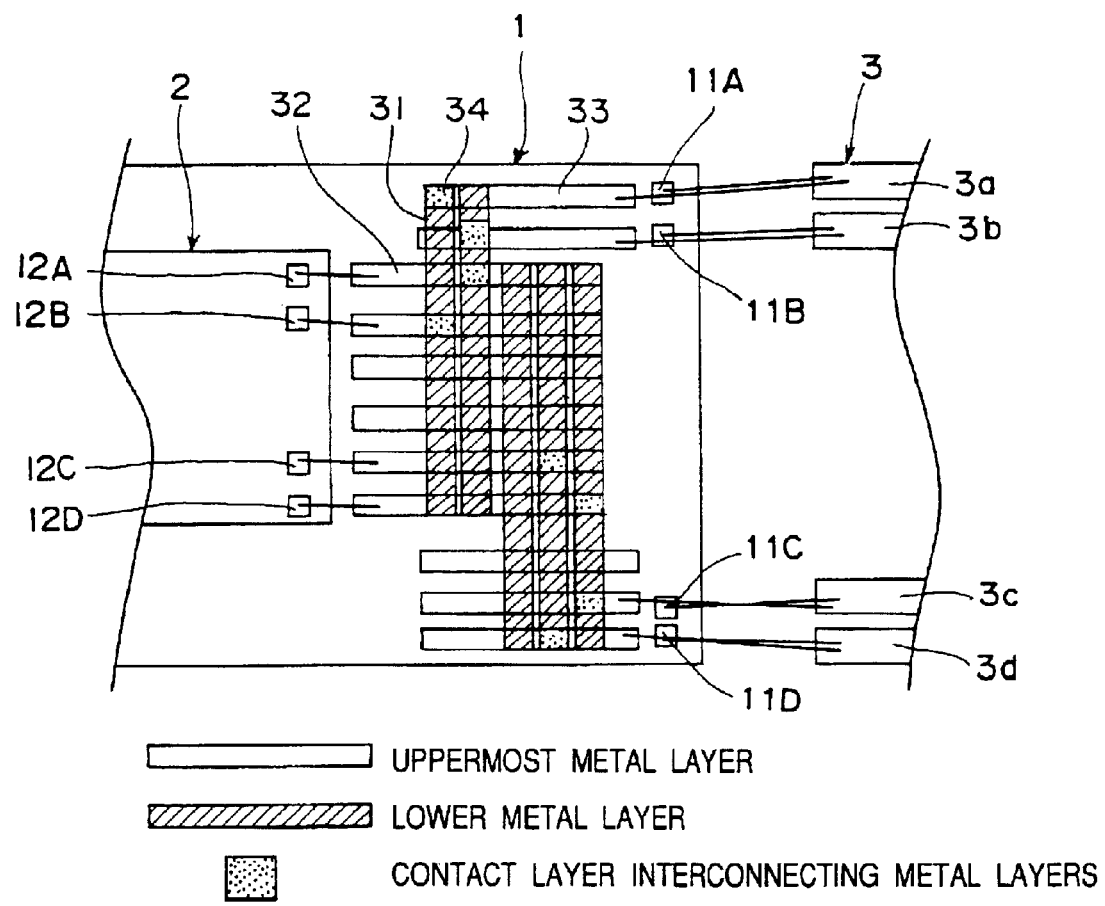
FIG. 4 is a schematic plan view of the semiconductor IC device shown in FIG. 3.

Referring now to FIGS. 3 and 4, an example of the relay electrode having a plurality of conductive layers at different levels will be described below. In FIGS. 3 and 4, those parts same as those shown in FIG. 2 are denoted by the same reference numerals and description thereof is omitted herein.

As shown in FIG. 3, the relay electrodes each are constituted of metal wires 32 and 33 as an example of an upper-surface-side first conductive layer, a metal wire 31 as an example of a second conductive layer formed at a position deeper, i.e., lower than the metal wires 32 and 33, and contact parts 34 as an example of a connection portion. The metal wires 32, 33 are oblong and extend in a direction intersecting almost at right angles the edge of the first or second semiconductor IC chip 1 or 2 along which the pads 11A–11D or 12A–12D are arranged. On the other hand, the metal wires 31, which are also oblong, extend in a direction intersecting almost at right angles the metal wires 32 and 33. The contact parts 34 are provided at intersections between the associated metal wire 31 and metal wires 32, 33 to thereby electrically connect the lower metal wire 31 to the upper metal wire 32 as well as to the upper metal wire 33. The metal wires 32 associated with the pads 12A–12D respectively are disposed so as for one end thereof to confront the associated pads 12A–12D. On the other hand, the metal wires 33 each associated with one of the metal wires 32 are disposed so as for one end thereof to confront the corresponding pads 11A–11D. The metal wires 31 are embedded in a protection film 38, and most parts of the metal wires 32 and 33 are also embedded in the protection film 38, with only the upper surface of one end of each of the metal wires 32 and 33 exposed. As shown in FIG. 4 as well, the metal wires 32 and 33 are composed of an uppermost metal layer of the lower first semiconductor IC chip 1, and the metal wires 31 are composed of a metal layer disposed lower than the metal layer for the metal wires 32 and 33. By disposing the contact parts 34 optionally and adequately, it is possible to accommodate the relay electrodes to the disposition or sequence of the pads of the second semiconductor IC chip 2.

Since the metal wires 31, 32, and 33 and the contact parts 34 constitute the relay electrodes, the relay electrodes are three-dimensional. This prevents the relay electrodes from mutual crossing and hence mutual electrical connection, which would tend to occur when the relay electrodes are complicated in the configuration and geometry.

Since the metal wires 32 and 33 disposed at the upper-surface side of the first semiconductor IC chip 1 are made of metal, wire bonding of these metal wires 32 and 33 is available.

At least two metal wires 32 and 33 are required for one pad of the second semiconductor IC chip 2.

Figure 5:
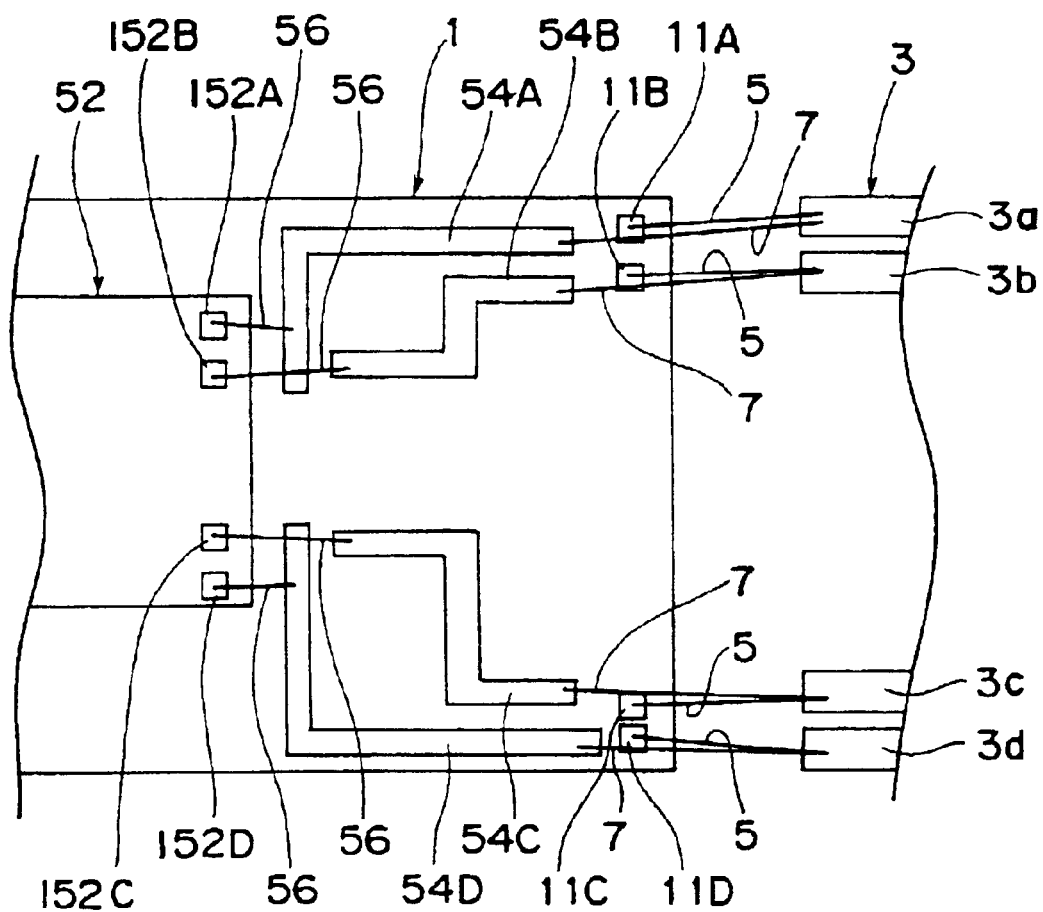
FIG. 5 is a schematic plan view of a semiconductor IC device according to another embodiment of the present invention.

FIG. 5 is a schematic plan view showing a semiconductor IC device of another embodiment of the present invention. In FIG. 5, those parts same as the parts shown in FIG. 2 are denoted by the same reference numerals and description thereof is omitted herein. The device of FIG. 5 is different from the device of FIG. 2 only in an upper second semiconductor IC chip 52, metal wires 54A–54D, and second conductive wires 56.

The semiconductor IC device has a first semiconductor IC chip 1 and a second semiconductor IC chip 52 which is mounted on the first semiconductor IC chip 1 and smaller than the first semiconductor IC chip 1. The pads of the second semiconductor IC chip 52 are arranged in the order of address pad 152A, I/O pad 152B, I/O pad 152C, and address pad 152D from the upper side of FIG. 5 to the lower side thereof. In this case, the sequence of the pads of the second semiconductor IC chip 52 is the same as that of the pads of the first semiconductor IC chip 1. Further, there is a big difference in size between the first semiconductor IC chip 1 and the second semiconductor IC chip 52.

As an example of relay electrodes, metal wires (dummy pads) 54A–54D are formed on the first semiconductor IC chip 1. Each of the metal wires 54A–54D also has one or two bent portions. One end of each of the metal wires 54A, 54B, 54C, and 54D is electrically connected to the address pad 152A, the I/O pad 152B, the I/O pad 152D, and the address pad 152D respectively via respective second conductive wires 56. More specifically, one end portion of the metal wires 54A and 54D extend along an edge of a second IC chip 52 (along which the pad 152A–152D are arranged) up to a position over one end of the metal wires 54B and 54C respectively, and the pads 152A and 152D are connected to the end portions of the metal wires 54A and 54D at a position outside of the end of the metal wires 54B and 54C with respect to the direction parallel with the edge of the second IC chip 52. Accordingly, the second conductive wires 56 do not cross each other. The metal wires 54A–54D are covered with a protection film except for both ends thereof, although the protection film is not shown in FIG. 5. In other words, only the surface of both ends of each of the metal wires 54A–54D is exposed.

In the semiconductor IC device having the construction, there is a big difference in size between the first semiconductor IC chip 1 and the second semiconductor IC chip 52. Because the second semiconductor IC chip 52 and the lead frame 3 are connected to each other through the metal wires 54A–54D, neither the second conductive wires 56 nor the third conductive wires 7 are too long. Thus, in forming a package sealing the first semiconductor IC chip 1 and the second semiconductor IC chip 52, the second conductive wires 56 and the third conductive wires 7 are prevented from being displaced by molding resin for forming the package. As a result, defective continuity between the second semiconductor IC chip 52 and the lead frame 3 is avoided. Therefore, in spite of a big difference in size between the first semiconductor IC chip 1 and the second semiconductor IC chip 52, optimum wiring is accomplished for the first semiconductor IC chip 1 and the second semiconductor IC chip 52 to thereby form these chips 1 and 52 into a composite device.

Because the second conductive wires 56 and the third conductive wires 7 are not long, the device is not susceptible to noise.

Figure 6:
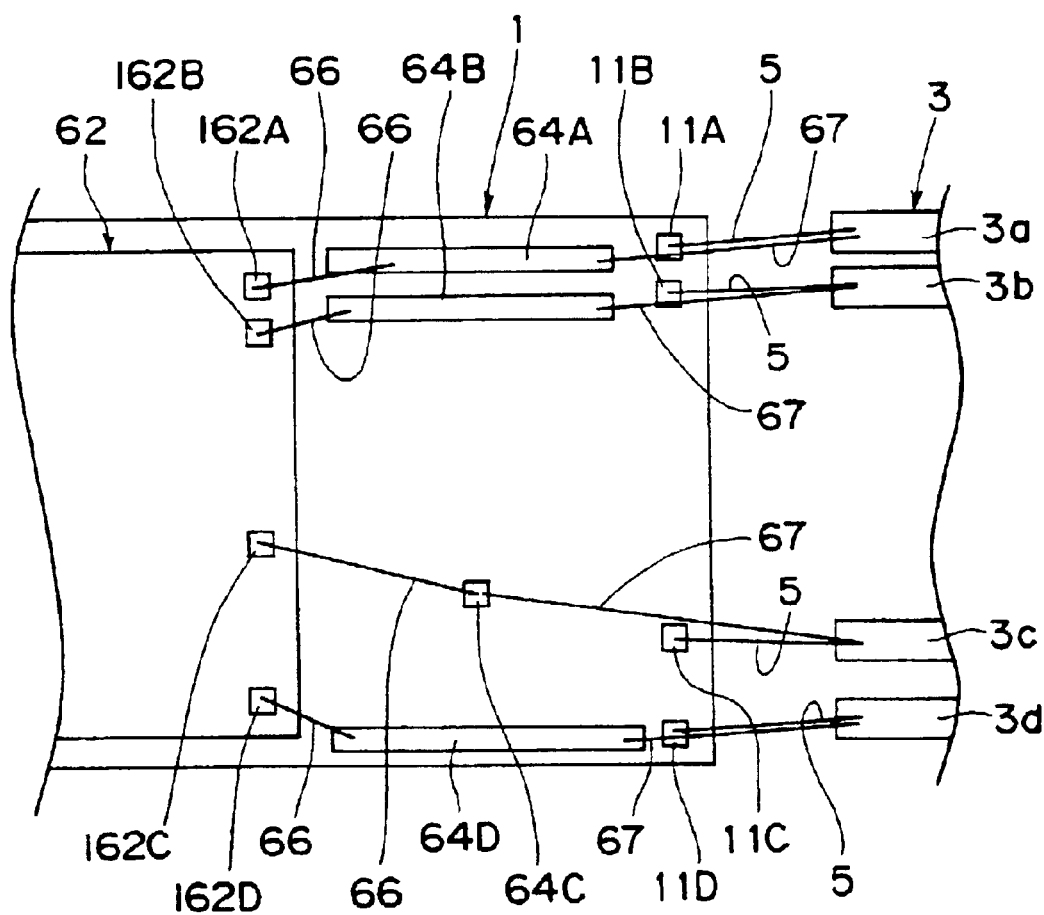
FIG. 6 is a schematic plan view of a semiconductor IC device of still another embodiment of the present invention.
Figure 7:
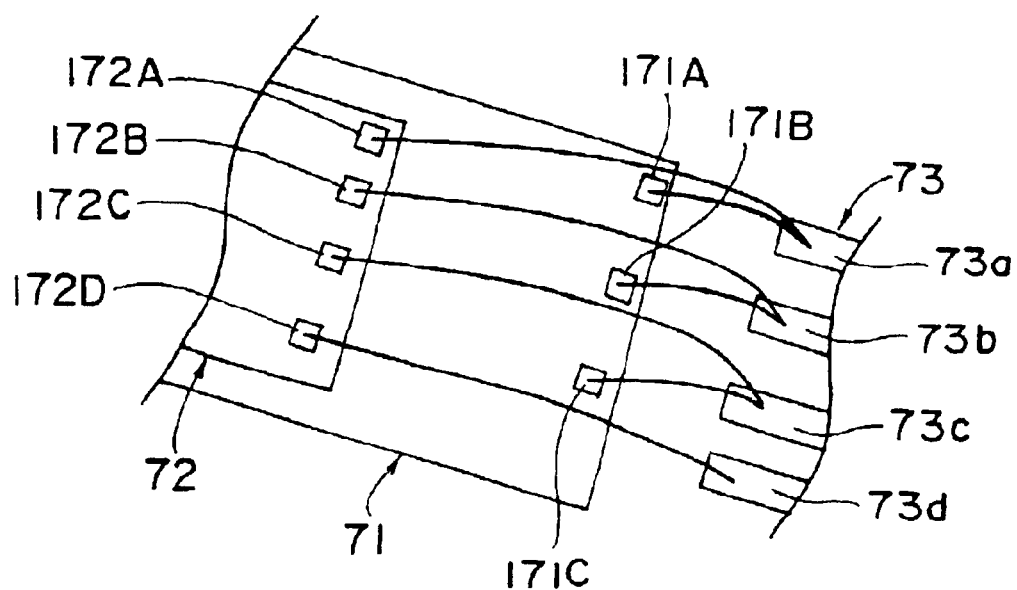
FIG. 7 is a schematic plan view of a background-art semiconductor IC device.
Figure 8:
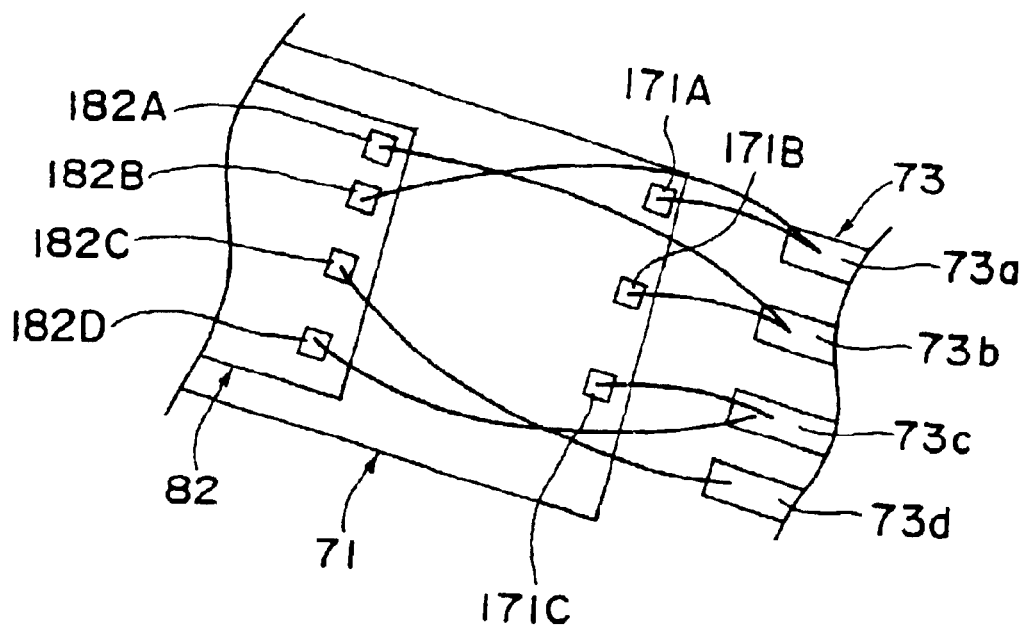
FIG. 8 is a schematic plan view of another background-art semiconductor IC device.

In the embodiment shown in FIG. 5, the metal wires 54A–54D each having a bent portion-provided pattern is formed on the first semiconductor IC chip 1. However as shown in FIG. 6, it is possible to form metal wires 64A, 64B, and 64D and a metal pad 64C on the first semiconductor IC chip 1 as the relay electrodes. The metal wires 64A, 64B, and 64D each have a rectangular, or oblong pattern, whereas the metal pad 64C has a square pattern. The pad sequence or arrangement of the lower first semiconductor IC chip 1 is the same as that of the upper second semiconductor IC chip 62. More specifically, the pad arrangement or sequence of the lower first semiconductor IC chip 1 is in the order of address pad 11A, I/O pad 11B, I/O pad 1C, and address pad 11D from the upper side of FIG. 6 to the lower side thereof. On the other hand, the pad sequence of the upper second semiconductor IC chip 62 is in the order of address pad 162A, I/O pad 162B, I/O pad 162C, and address pad 162D from the upper side of FIG. 6 to the lower side thereof.

One end of each of the metal wires 64A, 64B, and 64D is electrically connected to the address pad 162A, the I/O pad 162B, and the address pad 162D respectively via the respective second conductive wires 66. The second conductive wires 66 do not cross each other. The metal wires 64A, 64B, and 64D are covered with a protection film except for both ends thereof, although the protection film is not shown in FIG. 6. In other words, only the upper surface of both ends of each of the metal wires 64A, 64B, and 64D is exposed. On the other hand, the other end of each of the metal wires 64A, 64B, and 64D is electrically connected to the address lead electrode 3a, the I/O lead electrode 3b, and the address lead electrode 3d, respectively, of the lead frame 3 via the third conductive wires 67. The metal pad 64C and the I/O pad 162C are electrically connected to each other through the second conductive wire 66. The metal pad 64C and the I/O lead electrode 3c are electrically connected to each other via the third conductive wire 67. For that purpose, the upper surface of the metal pad 64C is exposed.

Needless to say, the present invention is applicable to a case where more than two semiconductor IC chips are stacked.

As the package of the semiconductor IC device of the present invention, a CSP (chip size package) is usable.

The size of the first semiconductor IC chip may be equal to that of the second semiconductor IC chip. Also, the upper second semiconductor IC chip may be larger than the lower first semiconductor IC chip.

Needless to say, the disposition of the pads of the first and second semiconductor IC chips and the number of the pads are not limited to those of the embodiments.

As apparent from the foregoing description, according to the semiconductor IC device of the present invention, the relay electrodes are formed on the lower first semiconductor IC chip to thereby connect the upper second semiconductor IC chip and the lead frame to each other through the relay electrodes even though the arrangement or sequence of pins (pads) of the first semiconductor IC chip and that of pins of the second semiconductor IC chip are different from each other. This allows the first and second semiconductor IC chips to be formed into a composite device (for example, a composite memory) without limitation on the arrangement of the pins (pads), irrespective of the types of the chips to be combined.

Even though there is a big difference in size between the first semiconductor IC chip and the second semiconductor IC chip, the upper second semiconductor IC chip and the lead frame are connected to each other with the relay electrodes formed on the lower first semiconductor IC chip. Thus the second conductive wires and the third conductive wires are not long and thus it is possible to avoid displacement of the wires by molding resin, and hence occurrence of defective continuity. As a result, yield is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device comprising:
a first semiconductor integrated circuit chip having a plurality of first electrodes;
a second semiconductor integrated circuit chip mounted on the first semiconductor integrated circuit chip and having a plurality of second electrodes;
a package sealing the first and second semiconductor integrated circuit chips;
a lead frame electrically connected to the first electrodes via respective first conductive wires;
a plurality of relay electrodes provided on the first semiconductor integrated circuit chip;
a plurality of second conductive wires electrically connecting the relay electrodes and respective second electrodes to each other;
a plurality of third conductive wires electrically connecting the relay electrodes and the lead frame to each other;
wherein a single conductive lead of said lead frame is electrically connected to both: (a) one of the first electrodes on the first chip via one of the first wires, and (b) one of the relay electrodes on the first chip via one of the third wires, so that said one of the first electrodes on the first chip is electrically connected to one of the second electrodes on the second chip via both the conductive lead of the lead frame and said one relay electrode; and
wherein no one of the second conductive wires crosses another one of the other second conductive wires and no one of the third conductive wires crosses another one of the third conductive wires.

2. The semiconductor integrated circuit device according to claim 1, wherein the first electrodes have attributes different from one another, and the second electrodes have attributes different from one another, and an arrangement of the attributes of the first electrodes and that of the attributes of the second electrodes are different from each other.

3. The semiconductor integrated circuit device according to claim 1, wherein the relay electrodes comprise at least two first conductive layers disposed at an upper-surface side thereof, a second conductive layer disposed at a lower level than the first conductive layers, and a connection part for electrically connecting each first conductive layer and the second conductive layer to each other.

4. The semiconductor integrated circuit device according to claim 3, wherein the first conductive layers and the second conductive layer are made of metal.

5. The semiconductor integrated circuit device according to claim 1, wherein the first electrodes are arranged along an edge of the first semiconductor integrated circuit chip, while the second electrodes are arranged along an edge of the second semiconductor integrated circuit chip approximately parallel with the edge of the first semiconductor integrated circuit chip; and at least one of the relay electrodes has at least one bent portion so that the ends of the at least one relay electrode are placed in different positions relative to a direction parallel to the edge of the first or second semiconductor integrated circuit chip.

6. The semiconductor integrated circuit device according to claim 3, wherein
the first electrodes are arranged along an edge of the first semiconductor integrated circuit chip, while the second electrodes are arranged along an edge of the second semiconductor integrated circuit chip approximately parallel with the edge of the first semiconductor integrated circuit chip;
the first conductive layers of each relay electrode are oblong and extend in a direction intersecting the edge of the first semiconductor integrated circuit chip;
the second conductive layer of each relay electrode is oblong and extends in a direction intersecting the first conductive layers; and
the connection part is provided at each intersection between the first and second conductive layers.

7. The semiconductor integrated circuit device according to claim 6, wherein one of the two first conductive layers is disposed adjacent to the associated second electrode, the other of the two first conductive layers is disposed adjacent to the first electrode corresponding to this second electrode.

8. A semiconductor integrated circuit device comprising:
a first semiconductor integrated circuit chip having a plurality of first electrodes;
a second semiconductor integrated circuit chip supported by the first semiconductor integrated circuit chip and having a plurality of second electrodes;
a lead frame, including a plurality of conductive leads, electrically connected to the first electrodes via respective first conductive wires;
a plurality of relay electrodes provided on the first semiconductor integrated circuit chip;
a plurality of second conductive wires electrically connecting the relay electrodes and respective second electrodes to each other;
a plurality of third conductive wires electrically connecting the relay electrodes and the lead frame to each other; and
wherein a single conductive lead of said lead frame is electrically connected to both: (a) one of the first electrodes on the first chip via one of the first wires, and (b) one of the relay electrodes on the first chip via one of the third wires, so that said one of the first electrodes on the first chip is electrically connected to one of the second electrodes on the second chip via both the conductive lead of the lead frame and said one relay electrode.

9. The semiconductor integrated circuit device according to claim 8, wherein the first electrodes have attributes different from one another, and the second electrodes have attributes different from one another, and an arrangement of the attributes of the first electrodes and that of the attributes of the second electrodes are different from each other.

10. The semiconductor integrated circuit device according to claim 8, wherein the relay electrodes comprise at least two first conductive layers disposed at an upper-surface side thereof, a second conductive layer disposed at a lower level than the first conductive layers, and a connection part for electrically connecting each first conductive layer and the second conductive layer to each other.

11. The semiconductor integrated circuit device according to claim 10, wherein the first conductive layers and the second conductive layer are made of metal.

12. The semiconductor integrated circuit device according to claim 8, wherein the first electrodes are arranged along an edge of the first semiconductor integrated circuit chip, while the second electrodes are arranged along an edge of the second semiconductor integrated circuit chip approximately parallel with the edge of the first semiconductor integrated circuit chip; and at least one of the relay electrodes has at least one bent portion so that the ends of the at least one relay electrode are placed in different positions relative to a direction parallel to the edge of the first or second semiconductor integrated circuit chip.

13. The semiconductor integrated circuit device according to claim 10, wherein the first electrodes are arranged along an edge of the first semiconductor integrated circuit chip, while the second electrodes are arranged along an edge of the second semiconductor integrated circuit chip approximately parallel with the edge of the first semiconductor integrated circuit chip;

the first conductive layers of each relay electrode are oblong and extend in a direction intersecting the edge of the first semiconductor integrated circuit chip;

the second conductive layer of each relay electrode is oblong and extends in a direction intersecting the first conductive layers; and the connection part is provided at each intersection between the first and second conductive layers.

14. The semiconductor integrated circuit device according to claim 13, wherein one of the two first conductive layers is disposed adjacent to the associated second electrode, the other of the two first conductive layers is disposed adjacent to the first electrode corresponding to this second electrode.

15. The semiconductor integrated circuit device of claim 8, wherein first, second, third and fourth of the first electrodes have corresponding first, second, third and fourth attributes, and first, second, third and fourth of the second electrodes have the same corresponding first, second, third and fourth attributes, and wherein the first, second, third and fourth of the first electrodes on the first chip are in electrical communication with the first, second, third and fourth of the second electrodes on the second chip via respective relay electrodes, and wherein the first, second, third and fourth of the first electrodes on the first chip are arranged in a different order or sequence than are the first, second, third and fourth of the second electrodes on the second chip.

* * * * *